(12) United States Patent
Richter et al.

(10) Patent No.: US 7,333,791 B2
(45) Date of Patent: Feb. 19, 2008

(54) USE OF AN IMAGE REJECT MIXER IN A FORWARD DATA CHANNEL TUNER

(75) Inventors: Kurt J. Richter, Richardson, TX (US); Jerry T. Bolton, Plano, TX (US)

(73) Assignee: Microtune (Texas), L.P., Plano, TX (US)

( * ) Notice: Subject to any disclaimer, the term of this patent is extended or adjusted under 35 U.S.C. 154(b) by 1114 days.

(21) Appl. No.: 10/014,760

(22) Filed: Dec. 11, 2001

(65) Prior Publication Data

US 2003/0153293 A1    Aug. 14, 2003

(51) Int. Cl.
| | |
|---|---|
| H04B 1/10 | (2006.01) |
| H04B 1/16 | (2006.01) |
| H04B 1/26 | (2006.01) |
| H04B 1/28 | (2006.01) |
| H04B 1/18 | (2006.01) |

(52) U.S. Cl. .................. 455/302; 455/296; 455/340; 455/313; 455/323; 455/333; 455/285; 455/290; 455/307

(58) Field of Classification Search .......... 455/296, 455/302, 304–305, 313, 333, 340, 323, 285, 455/290, 307
See application file for complete search history.

(56) References Cited

U.S. PATENT DOCUMENTS

| | | | |
|---|---|---|---|
| 4,115,737 A | 9/1978 | Hongu et al. | |
| 4,581,643 A | 4/1986 | Carlson | |
| 4,726,072 A | 2/1988 | Yamashita et al. | |
| 4,742,566 A | 5/1988 | Nordholt et al. | |
| 4,979,230 A | 12/1990 | Marz | |
| 5,038,404 A | 8/1991 | Marz | |
| 5,060,297 A | 10/1991 | Ma et al. | |
| 5,140,198 A | 8/1992 | Atherly et al. | |
| 5,200,826 A | 4/1993 | Seong | |
| 5,311,318 A | 5/1994 | Dobrovolny | |
| 5,321,852 A | 6/1994 | Seong | |
| 5,390,346 A | 2/1995 | Marz | |
| 5,428,836 A | 6/1995 | Sanecki et al. | |
| 5,563,545 A | 10/1996 | Scheinberg | |
| 6,081,697 A | 6/2000 | Haartsen | |

(Continued)

FOREIGN PATENT DOCUMENTS

EP    0 779 707 A1    6/1997

(Continued)

OTHER PUBLICATIONS

International Search Report for PCT/US02/38886, Sep. 12, 2003.

(Continued)

*Primary Examiner*—Barry Taylor
(74) *Attorney, Agent, or Firm*—Fulbright & Jaworski LLP (57) ABSTRACT

Disclosed are systems and methods which utilize an image reject mixer in an out-of-band mixer application such as in a forward data channel frequency converter. For example, according to a preferred embodiment, an image reject mixer is utilized to provide a relatively high degree of image rejection with respect to an out-of-band signal, thereby relaxing the requirement for filtering in the signal path leading to the mixer circuitry. Preferred embodiments of the invention are substantially or fully implemented utilizing integrated circuit technology.

48 Claims, 2 Drawing Sheets

U.S. PATENT DOCUMENTS

| | | | |
|---|---|---|---|
| 6,249,194 B1* | 6/2001 | Watanabe et al. | 333/133 |
| 6,285,865 B1 | 9/2001 | Vorenkamp et al. | |
| 6,314,279 B1 | 11/2001 | Mohindra | |
| 6,377,315 B1* | 4/2002 | Carr et al. | 348/726 |
| 6,625,222 B1* | 9/2003 | Bertonis et al. | 375/259 |
| 6,674,409 B2* | 1/2004 | Cheah | 343/795 |
| 6,681,103 B1* | 1/2004 | Rogers et al. | 455/302 |
| 7,050,778 B1* | 5/2006 | Olson | 455/296 |
| 2001/0027095 A1 | 10/2001 | Wang | |
| 2003/0206065 A1* | 11/2003 | Gomez | 331/16 |

FOREIGN PATENT DOCUMENTS

EP        0 849 873 A1     6/1998

OTHER PUBLICATIONS

Meyer, Robert G. "A 1-GHz BiCMOS RF Front-End IC." IEEE Journal of Solid-State Circuits; vol. 29 No. 3 (Mar. 1994): 350-355.

Kinget, Peter and Michiel Steyaert. "A 1 GHz CMOS Upconversion Mixer". IEEE Custom Integrated Circuits Conference. (1996) 197-200, December.

Crols, Jan, and Michel S. J. Steyaert. "A 1.5 GHz Highly Linear CMOS Downconversion Mixer." IEEE Journal of Solid-State Circuits. vol. 30 No. 7 (Jul. 1995). 736-742.

Kuhn, William B., William Stephenson, and Aicha Elshabini-Riad. "A 200 MHz CMOS Q-Enhanced LC Bandpass Filter." IEEE Journal of Solid-State Circuits. vol. 31 No. 8 (Aug. 1996). 1112-1122.

Okanobu, Taiwa, Hitoshi Tomiyama, and Hiroshi Arimoto. "Advanced Low Voltage Single Chip Radio IC." IEEE Transactions on Consumer Electronics . vol. 38 No. 3. (Aug. 1992) 465-475.

Crols, Jan, and Michiel Steyaert. "An Analog Integrated Polyphase Filter for a High Performance Low-IF Receiver." 1995 Symposium on VLSI Circuits Digest Of Technical Papers. (1995) 87-88, December.

Anadigics, Inc. CATV/TV/Cable Modem Upconverter MMIC. Warren NJ (Apr. 22, 1998).

Anadigics Inc. VHF/UHF CATV/TV Tuner Dowconverter. Warren, NJ. (Apr. 22, 1998).

Anadigics, Inc. Anagics Technical Brief. Upconverter MMIC for CATV Preliminary. Warren, NJ. (Jan. 11, 1994).

Archer, John, and John Granlund, and Robert E. Mauzy. "A Broad-Band UHF Mixer Exhibiting High Image Rejection over a Multidecade Baseband Frequency Range." IEEE Journal of Solid-State Circuits, vol. SC-16 No. 4 (Aug. 1981) 385-392.

"Double-balanced mixer and oscillator" Phillips Semiconductors. (Nov. 7, 1997). 1-11.

Gilbert, Barrie. "Demystifying the Mixer" Analog Devices Inc. (Apr. 1994). 1-58.

Scheinberg, N., et al. "A GaAs Up Converter Interated Circuit for a Double Conversion Cable TV "Set-Top" Tuner" International Conference on Consumer Electronics. (Jun. 1993). 108-109.

Maier, G.M., et al. "Double Conversion Tuner a Must for the Future?" IEEE Transaction on Consumer Electronics, vol. 38, No. 3. (Aug. 1992). 384-388.

Gilbert, Barrie and Baines, Rupert. "Fundamentals of Active Mixers" Applied Microwave and Wireless. (1995). 10-27, December.

Muller, J-E., et al. "A Double-Conversion Broad Band TV Tuner with GaAs ICs." GaAs IC Symposium Technical Digest. (1984). 97-98, December.

Nakatsuka, T., et al. , "Low Distortion and Low Noise Oscillator Mixer for CATV Converters." GaAs Symposium Technical Digest. (1988). 161-164.

Brady, Vernon, et al. "Development of a Monolithic FET Ka-Band Single Side Band UFConverter and Image Reject Downconverter." GaAs Symposium Technical Digest (Oct. 1989) 189-192.

Ablassmeier, Ulrich, et al. "GaAs FET Upconverter for TV Tuner" IEEE Transactions on Electron Devides, vol. ED-27, No. 6. (Jun. 1980). 1156-1159.

Maas, Stephen A. "A GaAs MESFET Mixer with Very Low Intermodulation" IEEE Transactions on Microwave Theory and Techniques, vol. MTT-35, No. 4. (Apr. 1987). 425-429.

Pandula, Louis. "Image Reect and Image Canceling Mixers" RF Design. (Apr. 1995). 60-65.

Svelto, F., et al. "A Low-Voltage Topology After CMOS RF Mixers." IEEE Transactions on Consumer Electronics., vol. 45, No. 2 (May 1999). 299-309.

Gilbert, Barrie. "The MICROMIXER: A highly Linear Variant of the Gilbert Mixer using a Bisymmetric Class-AB Input Stage" IEEE Journal of Solid-State Circuits, vol. 32, No. 9, (Sep. 1997). 1412-1423.

Ducourant, Thierry, et al. "A 3 Chip GaAs Double Conversion TV Tuner System with 70 db Image Rejection." Monolithic Circuits Symposium Digest of Papers. (1988). 87-90, December.

Torji, K., et al. "monolithic Integrated VHF TV Tuner." IEEE Transactions on Consumer Electronics, vol. CE-26. (May 1980). 180-189.

MC13143: Ultra Low Power DC-2.4 GHz Linear Mixer: Motorola, Inc. Issue 2. (1996). 1-8, December.

Maier, Gerd M. "New System Approach to TV Tuner Design." IEEE Transactions on Consumer Electronics, vol. 36, No. 3. (Aug. 1990). 403-406.

McDonald, Mark D. "A 2.5GHz BiCMOS Image-Reject Front-End" IEEE International Solid-State Circuits Conference. (1993). 144-145, December.

Lovelace, David, et al. "Silicon Upconverter RF IC Simplifies Cable Modem Designs" Microwaves & RF (Mar. 1997). 136-142.

Farmer, James O. "Specifications for Tuner Design for use in Cable Ready Television Receivers and VCRs." IEEE Transactions on Consumer Electronics, vol. 36, No. 3,. (Aug. 1990). 660-668.

Abidi, Asad A. "Direct-Conversion Radio Transceivers for Digital Communications." IEEE International Solid-State Circuits Conference. (1995). 186-187; 363-364, December.

Al-Hashimi, Bashir. "Understand the Fundamentals of Passive Video Filters." Microwaves & RF. (May 1996). 171-178.

Crols, Jan and Michiel Steyaert. "A Fully integrated 900MHz CMOS Double Quadrature Downconverter" IEEE International Solid-State Circuits Conference. (1995). 136-137, December.

Long, John R., et al. "A Low-Voltage Silicon Bipolar RF Front -End for PCN Receiver Applications." IEEE International Solid-State Circuits Conference. (1995). 104-105; 140-141, December.

Sabin, William E. & Edgar O. Schoenike. "Single -Sideband Systems & Circuits." McGraw Hill Book Company. New York. (1987). 88-134, 181-213, December.

"Opencable Set-top Terminal CORE Functional Requirement for Bi-directional Cable" Interim Specification, Cable Television Laboratories, Inc. 2000; pp. 12-14, December.

"A Dual-Channel QAM/QPSK Receiver IC with Integrated Cable Set-Top Box Functionality" Lionel D'Luna et al.; IEEE 1998 Custom Integrated Circuits Conference; pp. 351-352, December.

* cited by examiner

USE OF AN IMAGE REJECT MIXER IN A FORWARD DATA CHANNEL TUNER

TECHNICAL FIELD OF THE INVENTION

The invention relates generally to communication signal processing and, more particularly, to frequency conversion of an out of band signal using an image reject mixer.

BACKGROUND OF THE INVENTION

In particular radio frequency (RF) applications it may be desirable to utilize a signal which is relatively low in amplitude as compared to other signals present in a communication system and/or which is present in a signal channel having other signals or noise energy very near thereto. Providing signal processing, such as signal down-conversion common in signal tuner applications, is particularly challenging with respect to such signals.

The OPENCABLE specifications from Cable Television Laboratories, Inc., for example, provide for three major RF functions via a common signal path, wherein the signal levels associated with one or more of the functions are significantly attenuated with respect to other ones of the signals. Moreover, the OPENCABLE signal channels are established very near other signal channels and/or occurrences of noise energy. To further complicate operation according to OPENCABLE specifications, the specifications establish relatively stringent signal quality requirements.

Specifically, the three major functions provided by the OPENCABLE specifications include a forward application terminal (FAT), a forward data channel (FDC), and a reverse data channel (RDC). The forward application terminal provides downstream analog National Television System Committee (NTSC) signals and high speed digital 64/256 quadrature amplitude modulation (QAM) signals in 6 MHz channel spacings. The forward data channel provides downstream low speed digital quaternary phase-shift keying (QPSK) signals in 1.0, 1.5, or 2.0 MHz channel spacings. The reverse data channel provides upstream low speed digital QPSK signals. Collectively, the forward data channel and the reverse data channel are often referred to as out-of-band.

The forward data channel of the OPENCABLE specification is provided for transmission within the 70 MHz to 130 MHz frequency band, and may be down-converted to a particular frequency, such as 36 MHz, for use by a terminal device, such as a set-top box. The forward application terminal channels are provided for transmission within the 54 MHz to 864 MHz frequency band, inclusive of the 70 MHz to 130 MHz frequency band (i.e., the 70 MHz to 130 MHz frequency band may be mixed use). Signals of the forward data channel are typically as much as 22 dB lower in amplitude than signals of the forward application terminal channels. Yet the output signal to noise and distortion (SINAD), or carrier to noise and interference (C/(N+I)), for the forward data channel is 20 dBc. These specifications lead to difficult and demanding signal processing requirements.

Specifically, forward data channel processing circuitry operating according to the aforementioned OPENCABLE specifications must accept signals from 70 MHz up to 130 MHz and provide down-conversion thereof to result in a signal to noise and distortion ratio of at least 20 dBc. However, at typical down-conversion frequencies, such as the aforementioned 36 MHz, images of the accepted frequency band are very near the frequencies of the accepted bandwidth. For example, the image frequency of 70 MHz, when down-conversion to 36 MHz is implemented, is 142 MHz (70+(2·36)=142). Accordingly, operation according to the specification requires down-conversion of frequencies as high as 130 MHz while needing to exclude images as low as 142 MHz.

Typical forward data channel processing circuitry which has been proposed includes a series of low pass filters provided in the signal path prior to a down-converter in order to reject noise energy including image frequencies, such as the aforementioned 142 MHz image frequency. For example, typical implementations utilize a down-converter having mixer oscillator circuitry outputting the down-converted signal as well as the image of the RF input. Therefore, to provide the desired signal quality at the output of such circuitry, it is necessary to filter out the image frequency entirely externally, such as by using discrete element capacitors and inductors in a discrete filter arrangement.

However, it is very difficult to build a sufficient low pass filter to adequately reject frequencies so closely spaced, such as with the 12 MHz separation between the high end pass frequency of 130 MHz and the 142 MHz image frequency. Specifically, in operation according to the OPENCABLE specification, required image rejection is set forth by the equation: (FDC to FAT adjacent channel amplitude)+(required signal to noise and distortion ratio)+(sufficient margin to all for other sources of noise and distortion) which, in practice, may establish an image rejection requirement of approximately 22 dB+20 dB+10 dB=52 dB. The difficulty in implementing circuitry to achieve such image rejection arises due to both the large amount of image rejection required, and the close spacing between the desired and image frequencies.

Building a low pass filter network suitable for meeting the image rejection requirements above, particularly from discrete components available today at costs conducive to mass production of circuitry acceptable in the marketplace in applications such as cable television terminal devices and/or broadband communication devices, is difficult. Moreover, in order to facilitate mass production of such circuits, it is desirable to avoid requiring manual alignment or adjustment of circuit attributes, as is commonly required with discrete component implementations.

One prior art solution with respect to providing such filtering has been to utilize a surface acoustic wave (SAW) filter rather than the multiple discrete component filter stages discussed above. However, the use of SAW filters is itself not without disadvantages. For example, SAW filters provide fixed pass-bands and, therefore, are useful only in situations where an out-of-band signal to be utilized is of a fixed frequency. Moreover, SAW devices are not capable of integrated circuit implementation using current technology and, therefore, must be provided as a discrete circuit component.

Accordingly, a need exists in the art for systems and methods that provide high signal quality output frequency conversion of signals relatively low in amplitude as compared to other signals present in a communication system and/or which are present in a signal channel having other signals or noise energy very near thereto. A further need exists in the art for such systems and methods to be adapted for mass production and/or deployment with little or no manual alignment or adjustment thereof.

BRIEF SUMMARY OF THE INVENTION

The present invention is directed to a system and method which utilizes an image reject mixer in an out-of-band mixer application such as in a forward data channel tuner. For example, according to a preferred embodiment, an image reject mixer may be utilized to provide a relatively high degree of image rejection with respect to an out-of-band signal, thereby relaxing the requirement for filtering in the signal path leading to the mixer circuitry. Accordingly, a preferred embodiment of the present invention provides an image reject mixer providing approximately 20-25 dB of image rejection in combination with a filter network providing approximately 27-32 dB of image rejection, for use with a forward data channel of a cable system protocol, such as that of the OPENCABLE specifications.

A technical advantage of the present invention is that frequency conversion of signals, having relatively low amplitude as compared to other signals present in a communication system, provides high signal quality output, such as carrier to noise and interference ratios of approximately 20 dB. Similarly, a technical advantage of the present invention is that frequency conversion of signals, having other signals or noise energy very near thereto, provides high signal quality output.

A further technical advantage of the present invention is that high signal quality output is provided from frequency conversion using circuitry which minimizes reliance upon discrete components and is adapted for mass production and/or deployment with little or no manual alignment or adjustment thereof.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

DETAILED DESCRIPTION OF THE INVENTION

Figure 1A:
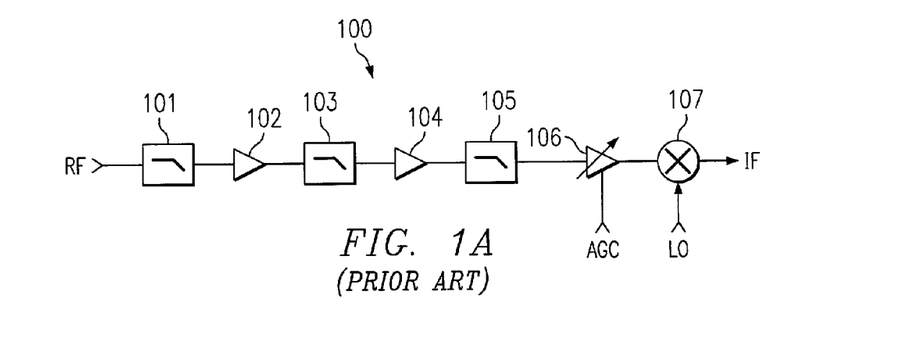
FIG. 1A shows a prior art forward data channel frequency conversion circuit.

Directing attention to FIG. 1A, frequency conversion circuitry for use in converting a forward data channel provided according to the OPENCABLE specifications, as has typically been proposed, is shown generally as frequency conversion circuit 100. Specifically, FIG. 1A shows a high level block diagram of frequency conversion circuitry, including low pass filter 101, fixed gain buffer amplifier 102, low pass filter 103, fixed gain buffer amplifier 104, low pass filter 105, adjustable gain amplifier 106, and mixer 107.

In operation according to the embodiment of FIG. 1A, and as is typical in implementations for which frequency conversion circuit 100 would be deployed, an RF forward data channel signal in the frequency range of 70 MHz to 130 MHz would be provided at the port labeled RF for down-conversion to 36 MHz by frequency conversion circuitry 100 and output at an intermediate frequency (IF) at the port labeled IF. It should be appreciated that if a forward data channel signal at 70 MHz is selected for down-conversion to 36 MHz, the local oscillator frequency (provided to the port labeled LO) may be 106 MHz (i.e., 106 MHz–70 MHz=36 MHz). However, mixer 107 will provide output of signals in addition to that which is the difference between the local oscillator frequency and the signal of interest. For example, noise energy or other signal energy appearing at any frequencies provided to mixer 107 will be mixed with the local oscillator frequency to result in frequency converted signals of various frequencies. Unfortunately, the frequencies of these other energy sources may appear at or near the frequency of the frequency converted signal of interest. For example, not only is the difference between 106 MHz and 70 MHz equal to 36 MHz, but the difference between 142 MHz and 106 MHz is also equal to 36 MHz.

The OPENCABLE specifications provide for forward data channel signaling in the frequency band from 70 MHz to 130 MHz and, therefore, mixer 107 is provided with at least this band of frequencies for down-conversion to a desired intermediate frequency (IF). However, in order to provide an output signal of a quality meeting the OPEN-CABLE specifications, it is necessary to substantially reject energy at 142 MHz and higher from the signal input of mixer 107. Accordingly, mixer 107 must be provided signals of up to 130 MHz while not being provided signals of 142 MHz.

It should be appreciated that it is typically not practical to provide a single filter with a frequency response sufficient to satisfactorily pass the high end frequencies of the OPEN-CABLE forward data channel pass band, without appreciable attenuation, and reject relatively close frequencies, such as the aforementioned 142 MHz signals having an image at the desired IF. Accordingly, a cascade filter approach is commonly proposed for use as shown in FIG. 1A, wherein multiple low pass filters are provided in series in order to pass desired signals of the forward data channel, the frequency band from 70 MHz to 130 MHz, while rejecting energy in frequencies as close to the pass band as 142 MHz. Typically, in such a cascade arrangement, at least low pass filter 105 of FIG. 1A provides a relatively complicated filter network in order to provide a precise cutoff frequency and/or a sharp frequency cutoff to thereby produce an IF output signal from mixer 107 meeting the desired signal quality requirements. A typical configuration of low pass filter 105 including a network of inductors and capacitors to provide a relatively precise cutoff frequency and/or sharp frequency cutoff are shown in FIG. 1B.

Figure 1B:
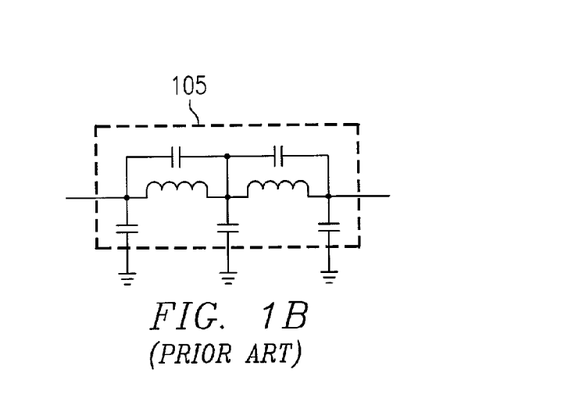
FIG. 1B shows a typical embodiment of a low pass filter used in the frequency conversion circuit of FIG. 1A.

However, implementing filters having precise cutoff frequencies and/or sharp frequency cutoff response, such as the LC network of FIG. 1B, using components of a typical quality available for mass production often require manual tuning or other adjustment in order to achieve a desired level of performance. Accordingly, the labor costs of a mass produced frequency conversion circuit as shown in FIG. 1A may be excessively high and/or the reliability of such circuits may be unacceptably low for consumer electronics deployment, such as in cable television set-top boxes or cable modems.

Moreover, the number of discrete components utilized in providing the filters of the above described frequency conversion circuit typically requires significant space. For example, the relatively complex filter circuit provided by low pass filter 105 generally must utilize discrete components in order to achieve the desired precise cutoff frequencies and/or sharp frequency cutoff response. However, as can be seen by the filter network of FIG. 1B, such a discrete component embodiment of the filter occupies an amount of space which is undesirable for many modem consumer electronic applications.

Figure 2A:
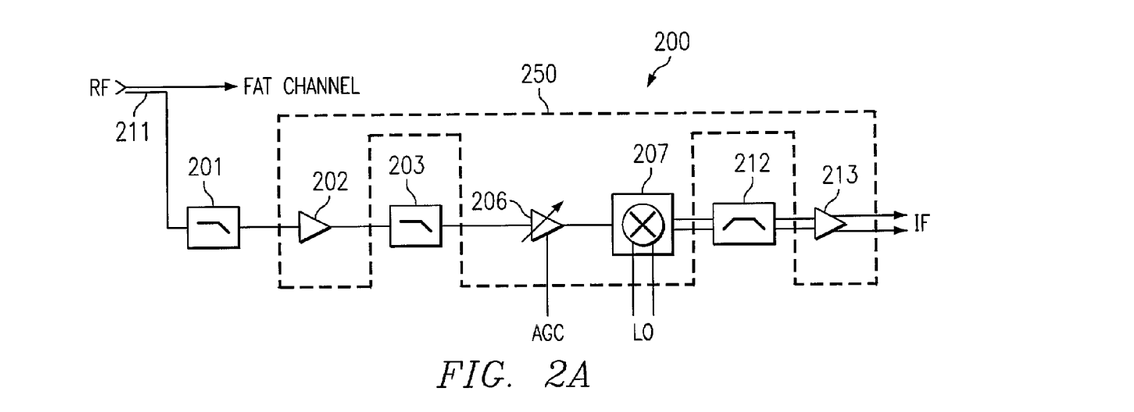
FIG. 2A shows a block diagram of a preferred embodiment forward data channel frequency conversion circuit of the present invention.
Figure 2B:
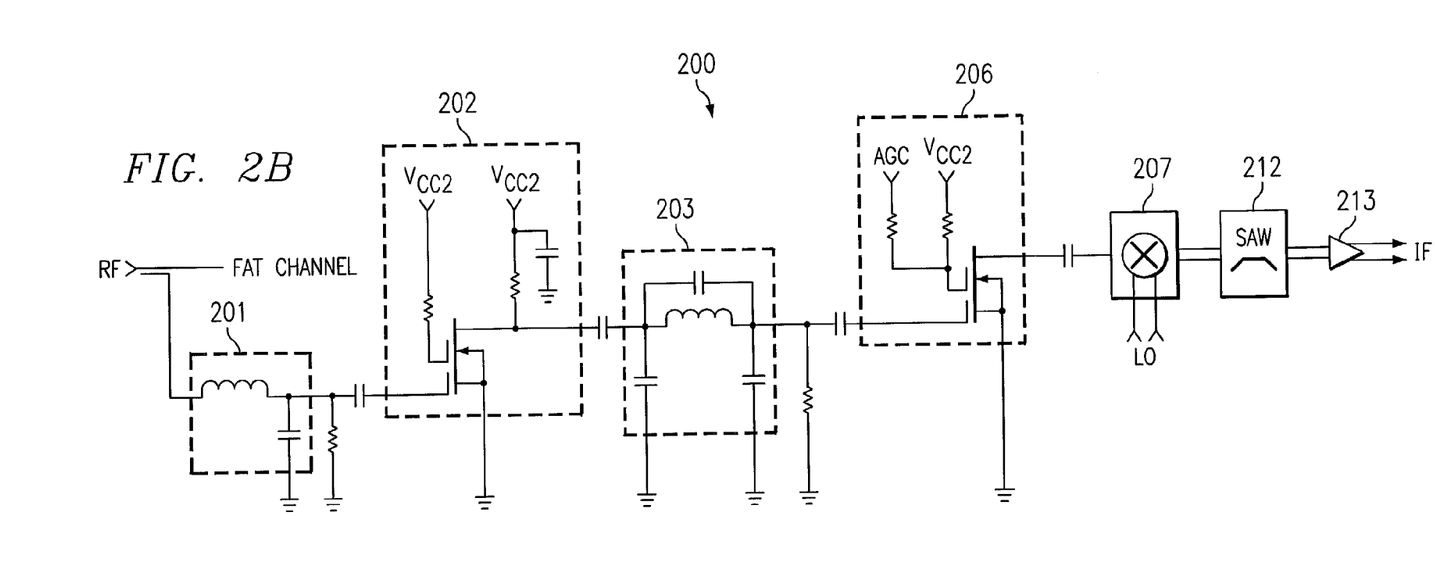
FIG. 2B shows a schematic diagram of a preferred embodiment of the forward data channel frequency conversion circuit of FIG. 2A.

Directing attention to FIGS. 2A and 2B, frequency conversion circuitry of a preferred embodiment of the present invention, such as may be used in converting a forward data channel provided according to the OPENCABLE specification, is shown generally as frequency conversion circuit 200. Specifically, FIG. 2A shows a high level block diagram of frequency conversion circuitry, including low pass filter 201, fixed gain buffer amplifier 202, low pass filter 203, adjustable gain amplifier 206, and image reject mixer 207. Also shown in FIG. 2A for completeness are coupler 211, intermediate frequency band pass filter 212, and output buffer amplifier 213.

Coupler 211 is shown in FIG. 2A for completeness, and is not directly utilized in the frequency conversion of signals. For example, a cable signal, including the aforementioned FAT channels and FDC, may be provided via a service provider's network to subscriber equipment, such as a set-top box or a cable modem, or other equipment utilizing FDC information. Coupler 211 may be provided within such equipment to pass the cable signal to components in the subsequent signal path while providing the cable signal to the frequency converter of the present invention. For example, coupler 211 may be a directional coupler having approximately 1 dB of loss in the through path, to thereby pass the FAT channel to a television tuner, and having approximately 10 dB of loss in the coupled leg thereof, to thereby feed the forward data channel to the frequency converter of the present invention.

As with coupler 211 discussed above, intermediate frequency band pass filter 212 and output buffer amplifier 213 are shown for completeness and are not directly utilized in the frequency conversion of signals. Intermediate frequency band pass filter 212 and output buffer amplifier 213 may be provided as an output stage of the frequency conversion circuit in order to provide blocking of undesired frequencies and buffering of the output signal.

In operation according to the embodiment of FIG. 2A, an RF signal including a out-of-band signal, such as a forward data channel signal in the frequency range of 70 MHz to 130 MHz of the OPENCABLE specification, may be provided at the port labeled RF. This signal is coupled to the frequency conversion circuit of the preferred embodiment for down-conversion, such as to intermediate frequencies in the range of 36-45 MHz, and output at an intermediate frequency (IF) at the port labeled IF. Specifically, the coupled signal is filtered by low pass filter 201, buffered by fixed gain buffer amplifier 202, filtered again by low pass filter 203, and amplitude adjusted by adjustable gain amplifier 206 before being provided to image reject mixer 207 of the preferred embodiment.

In contrast to the prior art circuit discussed above with respect to FIGS. 1A and 1B, in providing an output signal of a quality meeting the OPENCABLE specifications, the preferred embodiment of FIG. 2A utilizes only relatively simple filter networks. Directing attention to FIG. 2B, further detail with respect to a preferred embodiment implementation of the functional blocks of FIG. 2A is shown. In FIG. 2B each of low pass filters 201 and 203 are shown to include a relatively simple arrangement of discrete inductors and capacitors to thereby provide simple LC filters. Accordingly, the most simple filter network of the preferred embodiment, low pass filter 201, may provide a relatively coarse frequency cutoff point, such as passing signals at 130 MHz and rejecting signals at frequencies of approximately 150 MHz and greater where it is ultimately desired to reject signals at 142 MHz and greater. The more complex filter network of the preferred embodiment, low pass filter 203, although still providing a relatively simple filter circuit, may provide a more precise frequency cutoff point although not providing a sharp frequency cutoff response, such as to pass signals at 130 MHz and appreciably attenuate signals at 142 MHz and greater.

It should be appreciated that implementation of the relatively simple filters described above may be accomplished using readily available discrete components, such as inductors and capacitors commercially available having 10% tolerances, without the need for manual tuning or other adjustment while meeting the requirements for use in the preferred embodiment. Likewise, alternative embodiments of the present invention leverage the less demanding requirements of the above discussed preferred embodiment filters utilizing integrated circuit filter networks, such as where all or some of the above filter components are disposed on a common monolithic silicon substrate.

Image reject mixer 207 of the preferred embodiment is utilized in combination with the above described relatively simple filters in providing an output signal of the desired quality according to the present invention. Specifically, because image reject mixer 207 is itself able to reject at least a portion of the undesired signal energy, it is not necessary according to the preferred embodiment to reject all such undesired signal energy, such as that present at 142 MHz, prior to frequency conversion by image reject mixer 207.

It should be appreciated that preferred embodiment image reject mixers of the present invention are adapted to provide mixing with respect to a plurality of channels, such as for selection of forward data channels of a plurality of forward data channels in the frequency range of 70 MHz to 130 MHz. Accordingly, in such embodiments the use of a single SAW filter, in addition to not facilitating integration of the mixer and filtering circuitry, would generally not provide desirable signal processing characteristics. However, the low pass filters of the illustrated embodiment are preferably adapted to pass all such signals of interest while providing desired levels of attenuation with respect to signal energy at undesired image frequencies according to the present invention. Of course, embodiments of the present invention may utilize a tracking filter or filters, if desired.

Figure 3:
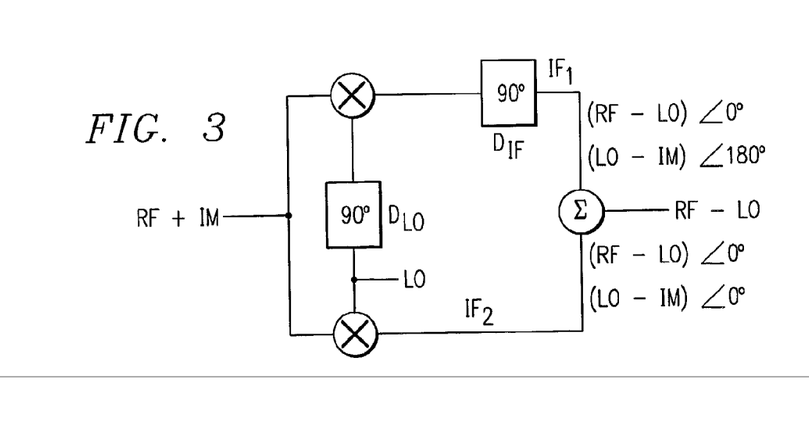
FIG. 3 shows a block diagram of an image reject mixer utilized in a preferred embodiment of the present invention.

Directing attention to FIG. 3, an image reject mixer, such as may be implemented as image reject mixer 207 of the preferred embodiment, is shown. As shown in FIG. 3, the signal provided to the image reject mixer may include both a desired RF component and an undesired image (IM) component. The input signal is split for mixing with a local oscillator (LO) frequency and a phase delayed LO (90° phase delayed in the illustrated embodiment), thereby providing a first intermediate frequency signal ($IF_1$) and a second intermediate frequency signal ($IF_2$). In the illustrated embodiment $IF_1$ comprises RF–LO at 0° and LO–IM at 180°. Similarly, $IF_2$ comprises RF–LO at 0° and LO–IM at 0°. The intermediate frequency signals are combined for output from the image reject mixer thereby canceling the LO–IM component of each of the intermediate frequency signals.

It should be appreciated that image reject mixer 207 of the preferred embodiment may be implemented utilizing integrated circuit technology, such as by disposing the components shown in FIG. 3 on a common monolithic silicon substrate. Moreover, amplifier circuits, such as fixed gain buffer amplifier 202, adjustable gain amplifier 206, and/or output buffer amplifier 213, may be implemented utilizing integrated circuit technology. Accordingly, a preferred embodiment of the present invention disposes each of fixed gain buffer amplifier 202, adjustable gain amplifier 206, image reject mixer 207, and output buffer amplifier 213 on a common monolithic substrate, represented by 250 of FIG. 2A, to provide a highly integrated circuit embodiment frequency conversion circuit. Additionally, as mentioned above, low pass filters 201 and 203 may be implemented utilizing integrated circuit technology and, therefore, an alternative embodiment of the present invention may provide any or all of low pass filter 201, fixed gain buffer amplifier 202, low pass filter 203, adjustable gain amplifier 206, image reject mixer 207, and output buffer amplifier 213 on a common monolithic substrate.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or late to be developed that perform substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A data channel tuner comprising:
   an input interface for accepting said data channel, wherein said input interface further accepts signal energy at a frequency associated with an image of said data channel as mixed by said tuner;
   a filter network coupled to said input interface, wherein said filter network utilizes filters comprising only first order filters, second order filters, or a combination thereof, a first filter of said filter network coarsely filtering signals at approximately 150 MHz and higher, a second filter of said filter network attenuating signals at 142 MHZ and higher; and
   an image reject mixer coupled to said filter network and providing frequency conversion of said data channel, the image reject mixer rejecting at least a portion of undesired signal energy.

2. The tuner of claim 1, wherein said filter network does not require manual tuning or adjustment.

3. The tuner of claim 2, further comprising:
   an output interface coupled to said image reject mixer providing said frequency converted data channel having a signal to noise and distortion of approximately 20 dB; and wherein signal energy of said data channel is approximately 20 dB lower in amplitude than said image frequency signal energy.

4. The tuner of claim 3 wherein said filter network prosides approximately 20 dB of rejection of said image frequency signal energy, and wherein said image reject mixer provides approximately 20 dB of rejection of said image frequency signal energy.

5. The tuner of claim 1, wherein said filter network utilizes only first order filters.

6. The tuner of claim 5, wherein said filter network comprises 2 first order filters.

7. The tuner of claim 1, further comprising:
   at least one amplifier disposed in a signal path between a filter of said filter network and said image reject mixer.

8. The tuner of claim 7, wherein said at least one amplifier and said image reject mixer are implemented using integrated circuit technology on a same substrate to thereby provide a highly integrated tuner circuit.

9. The tuner of claim 8, wherein said filter network is implemented using integrated circuit technology on said same substrate to thereby provide a substantially completely integrated tuner circuit.

10. The tuner of claim 1, wherein said image frequency signal energy is at a frequency approximately 10% removed from a frequency of said data channel.

11. The tuner of claim 10, wherein said image frequency signal energy is a frequency of approximately 142 MHz.

12. The tuner of claim 11, wherein said frequency of said data channel is approximately 130 MHz.

13. The tuner of claim 10, wherein said data channel is in the range of from approximately 70 MHz to 130 MHz, said frequency converted data channel is in the ranac of from approximately 36 MHz to 45 MHz, and said image frequency signal energy is in the range of from approximately 142 MHz to approximately 220 MHz.

14. The tuner of claim 1, wherein said data channel comprises a forward data channel and said image frequency signal energy comprises a forward access terminal signal.

15. The tuner of claim 1, wherein said data channel comprises a digital data stream.

16. A system for providing tuning of a particular signal in a signal stream including additional signal energy at an image frequency of said particular signal as frequency convened by said system, said system comprising:
   a filter network comprising a first filter coarsely filtering signals at approximately 150 MHz and higher and a second filter attenuating signals at 142 MHZ and higher; and
   an image reject mixer coupled to said filter network for providing frequency conversion of said particular signal and rejection of said additional signal energy at 142 MHz, wherein a signal energy of said particular signal is substantially less than said additional signal energy, said signal stream as converted being substantially without said additional signal energy.

17. The system of claim 16, wherein said particular signal and a signal corresponding to said additional signal energy are separated in frequency by approximately a 10% frequency difference.

18. The system of claim 16,
   wherein said first filter is a first order filter; and
   wherein the second filter is coupled to said first filter and provides less coarse rejection of said additional signal energy, wherein said second filter is a first order filter.

19. The system of claim 18, wherein said first and said second filters provide approximately 20 dB of signal rejection and said image reject mixer provides approximately 20 dB of signal rejection.

20. The system of claim 18, wherein said first and second filters are the only filters utilized by said system in a signal path prior to said image reject mixer and do not require manual tuning or adjustment.

21. The system of claim 18, wherein said image reject mixer is implemented as an integrated circuit, and wherein at least one of said first and second filters is implemented as an integrated circuit on a common substrate as said image reject mixer.

22. The system of claim 16, wherein said additional signal energy as present in said signal stream is approximately 20 dB above said particular signal as present in said signal stream.

23. The system of claim 22, wherein a frequency converted said particular signal output by said image reject mixer has a signal to noise and distortion of approximately 20 dB.

24. The system of claim 16, wherein said image reject mixer is implemented as an integrated circuit.

25. The system of claim 16, wherein said particular signal comprises a forward data channel and said additional signal energy is associated with a forward access terminal signal.

26. The system of claim 16, wherein a frequency of said additional signal energy is in the range of approximately 142 MHz to 220 MHz.

27. The system of claim 26, wherein a frequency of said particular signal is in the range of approximately 70 MHz to approximately 130 MHz.

28. A method for tuning a particular signal from a signal stream, said method comprising:
providing said signal stream having a first signal and a second signal both utilized substantially simultaneously by a subscriber station, wherein said second signal is offset from said first signal such that said second signal corresponds to an image frequency of said first signal;
coarsely filtering said signal stream at approximately 150 MHz and higher with a first filter and subsequently attenuating signals at 142 MHZ and higher with a second filter, wherein said filters comprise only first order filters, second order filters, or a combination thereof; and
mixing said signal stream using an image reject mixer to provide a frequency converted first signal substantially without said second signal by rejecting signals at 142 MHz, wherein a signal energy of said first signal is substantially less than a signal energy of said second signal.

29. The method of claim 28, wherein said first signal comprises a forward data channel and said second signal comprises an application channel.

30. The method of claim 28, wherein said filtering comprises:
filtering said sianal stream to provide relatively coarse filtering of said second signal prior to said mixing said signal stream.

31. The method of claim 30, wherein said filtering comprises:
coarsely filtering said signal stream using a first order filter or second order filter; and
less coarsely filtering said signal stream using a second first order filter.

32. The method of claim 28, wherein said first signal is approximately 20 dB down from said second signal.

33. The method of claim 28, wherein said filter network does not require manual tuning or adjustment.

34. A method for providing tuning of a data channel in a signal stream having an application signal offset from said data sianal such that said application signal corresponds to an image frequency of said data signal, said method comprising:
coarsely filtering said signal stream at approximately 150 MHz and higher with a first filter and subsequently attenuating signals at 142 MHZ and higher with a second filter, wherein said filters comprise only first order filters, second order filters, or a combination thereof, and wherein said filters do not require manual tuning or adjustment; and
mixing said filtered signal stream using an image reject mixer to provide a frequency converted said data channel substantially without said application signal.

35. The method of claint 34, wherein said filtering comprises:
coarsely filtering said signal stream using a first order filter; and
less coarsely filtering said signal stream using a second first order filter.

36. The method of claim 34, wherein a signal of said data channel is approximately 20 dB down from said application signal.

37. The method of claim 36, wherein said filtering provides approximately 20 dB of signal rejection with respect to said application signal and said mixing provides approximately 20 dB of signal rejection with respect to said application signal.

38. The method of claim 37, wherein said frequency converted data channel has a signal to noise and distortion of at least 20 dB.

39. A method for providing tuning of a signal of interest appearing in a signal stream including said signal of interest and a signal at an image frequency of said signal of interest, said method comprising:
providing said signal stream to a tuner circuit including an image reject mixer, wherein said image frequency signal as provided to said tuner circuit is substantially greater in amplitude than said signal of interest;
filtering said signal stream using a first filter that coarsely filters said signal stream at approximately 150 MHz and higher and a second filter that subsequently attenuates signals at 142 MHZ and higher; and
mixing said signal stream using said image reject mixer to provide a frequency converted said signal of interest substantially without said image frequency signal.

40. The method of claint 39, wherein said filtering comprises:
processing said signal stream by said tuner circuit to filter approximately 20 dB of said image frequency signal.

41. The method of claim 39, wherein said filtering comprises:
coarsely filtering said signal stream using a first order filter; and
less coarsely filtering said signal stream using a second first order filter.

42. The method of claim 39, wherein said signal of interest is offset from said image frequency signal by approximately a 10% frequency difference.

43. The method of claim 42, wherein said image frequency signal includes a signal at approximately 142 MHz and said signal of interest includes a signal at approximately 130 MHz.

44. The method of claim 39, wherein said mixing provides at least 20 dB of signal rejection with respect to said image frequency signal.

45. The method of claim 39, wherein said frequency converted signal of interest has a signal to noise and distortion of at least 20 dB.

46. A method for providing tuning of a forward data channel approximately 20 dB down from a forward application terminal signal in a signal stream, said method comprising:

coarsely filtering said signal stream at approximately 150 MHz and higher and less coarsely filtering said signal stream at 142 MHZ and higher, the filtering providing approximately 20 dB of filtering of said forward application terminal, wherein said filters comprise only first order filters, second order filters, or a combination thereof and said filters do not require manual tuning or adjustment; and mixing said filtered signal stream using an image reject mixer to provide a frequency converted said forward data channel substantially without said forward application terminal signal.

47. The method of claim 46, wherein said filtering comprises:

coarsely filtering said signal stream using a first order filter; and less coarsely filtering said signal stream using a second first order filter.

48. The method of claim 46, wherein at least a portion of said forward application terminal signal is offset from said forward data channel by approximately a 10% frequency difference.

* * * * *

UNITED STATES PATENT AND TRADEMARK OFFICE
CERTIFICATE OF CORRECTION

| | | |
|---|---|---|
| PATENT NO. | : 7,333,791 B2 | Page 1 of 1 |
| APPLICATION NO. | : 10/014760 | |
| DATED | : February 19, 2008 | |
| INVENTOR(S) | : Kurt J. Richter et al. | |

It is certified that error appears in the above-identified patent and that said Letters Patent is hereby corrected as shown below:

On the Title page item 75, located in the inventor's name (left hand column), delete "Jerry T. Bolton" and replace with --Jerry T. Bolton, Jr.--.

On the Title page item 56, located in the References Cited under U.S. Patent Documents, Foreign Patent Documents and Other Publications, please insert the following reference where appropriate:

--Other Publications

"250 MHz QAM IF Downconverter", California Eastern Laboratories --

In the Specification:

Column 5, line 13, delete the text "modem" and replace with --modern--.

In the Claims:

In Claim 4, Col 8, Line 3-4, delete the text "prosides" and replace with --provides--.

In Claim 13, Col 8, Line 34, delete the text "ranac" and replace with --range--.

In Claim 16, Col 8, Line 46, delete the text "convened" and replace with --converted--.

In Claim 30, Col 8, Line 59, delete the text "sianal" and replace with --signal--.

Signed and Sealed this

First Day of April, 2008

JON W. DUDAS
*Director of the United States Patent and Trademark Office*